(12) United States Patent
Chou et al.

(10) Patent No.: US 6,335,478 B1
(45) Date of Patent: Jan. 1, 2002

(54) THERMOPILE INFRARED SENSOR, THERMOPILE INFRARED SENSORS ARRAY, AND METHOD OF MANUFACTURING THE SAME

(75) Inventors: Bruce C. S. Chou, 11F-1. No. 27, Chien Chung Road; Mang Ou-Yang, 6F-2, No. 9, Lane 175, Wu Ling Road, both of Hsin Chu 300 (TW)

(73) Assignees: Bruce C. S. Chou; Mang Ou-Yang; Steve S. H. Shyu; Metrodyne Microsystem Corp., all of (TW)

( * ) Notice: Subject to any disclaimer, the term of this patent is extended or adjusted under 35 U.S.C. 154(b) by 0 days.

(21) Appl. No.: 09/628,677

(22) Filed: Jul. 28, 2000

(30) Foreign Application Priority Data

Nov. 4, 1999 (TW) .......................................... 88119394

(51) Int. Cl.$^7$ .............................................. H01L 35/28
(52) U.S. Cl. ....................................... 136/201; 136/225
(58) Field of Search ............................... 136/224, 225, 136/201

(56) References Cited

PUBLICATIONS

"Uncooled infrared focal plane array having 128×128 thermopile detector elements" Toshio Kanno et al., Technical Research and Development Institute, Japan Defense Agency. 1–2–24 Ikejiri, Setagaya–ku, Tokyo 154, vol. 2269 Infrared Technology X X (1994).

Volklein, F.; Blumers, M.; Schmitt, L., "Thermoelectric microsensors and microactuators (MEMS) fabricated by thin film technology and micromachining", Eighteenth International Conference on Thermoelectrics, 1999, pp. 285–293.*

* cited by examiner

*Primary Examiner*—Kathryn Gorgos
*Assistant Examiner*—Thomas H Parsons

(57) ABSTRACT

A thermopile infrared sensor includes a substrate, at least one thermocouple cantilever beam comprising at least one thermocouple, and a suspending membrane. The cantilever beam is formed above the substrate. The cantilever beam has a first end and a second end located away from the first end. The first end is attached to the substrate to form a cold junction. A predetermined distance is formed between the second end and the substrate. The suspending membrane is formed above the cantilever beam and is supported by the second end of the cantilever beam to form a hot junction. The cantilever beam is completely hidden underneath or covered by the suspending membrane. In addition, an integrated circuit, which is underneath the suspending membrane, can be integrated with the thermopile infrared sensor.

12 Claims, 16 Drawing Sheets

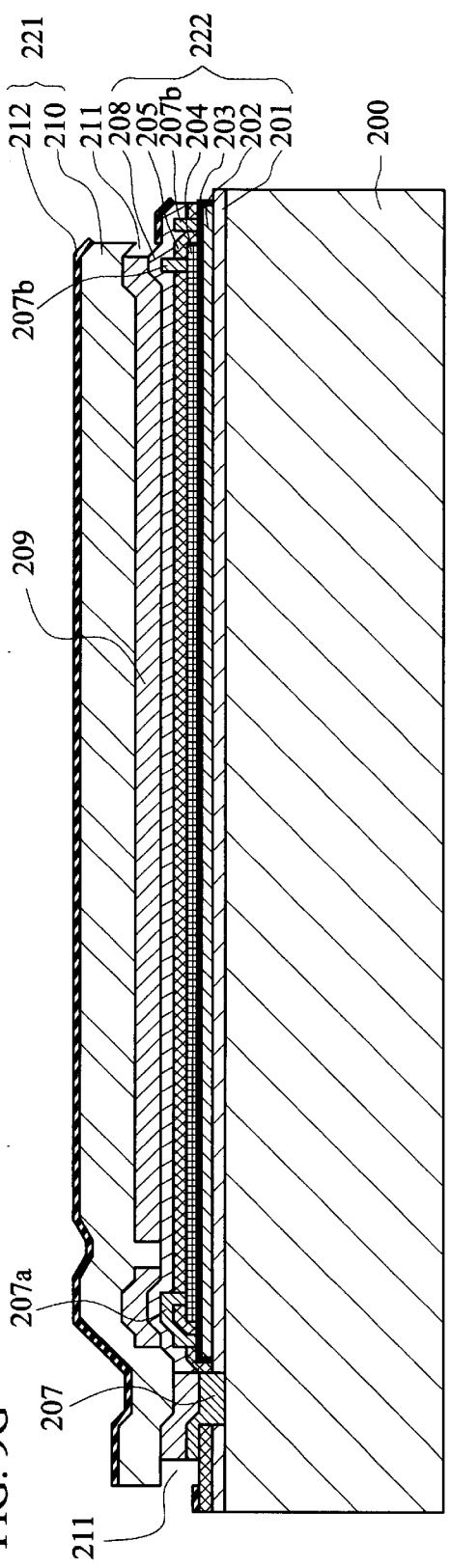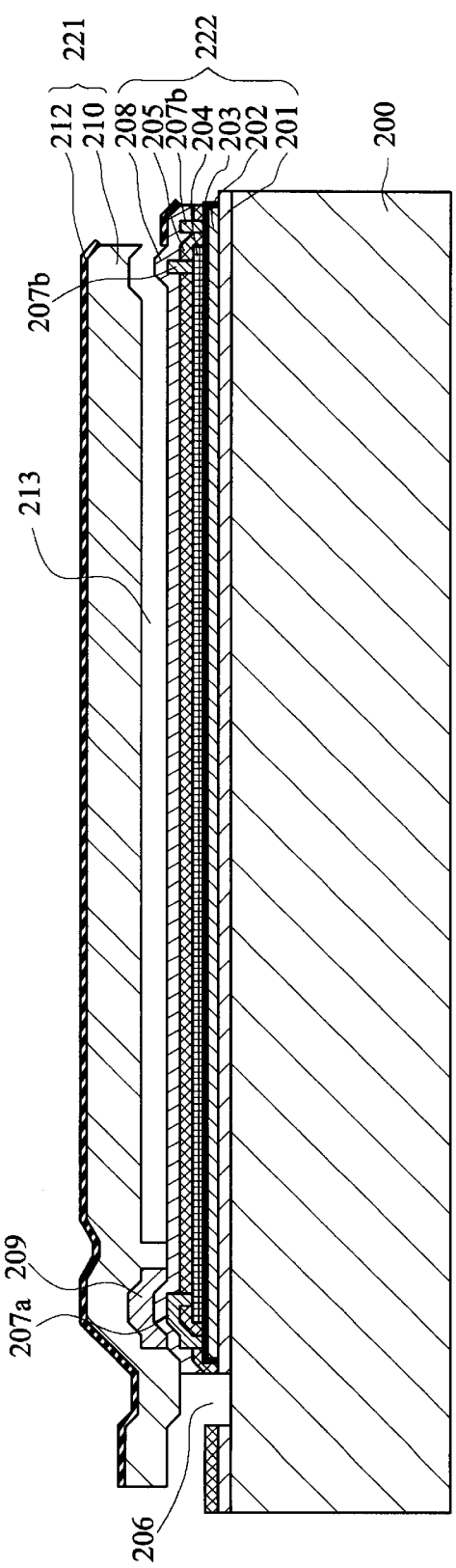

THERMOPILE INFRARED SENSOR, THERMOPILE INFRARED SENSORS ARRAY, AND METHOD OF MANUFACTURING THE SAME

BACKGROUND OF THE INVENTION

1. Field of the Invention

The invention relates to a thermopile infrared sensor, thermopile infrared sensors array, and a method of manufacturing the same, in particular, to a thermopile infrared sensor having hidden thermocouple cantilever beams with low solid thermal conductance, and to a thermopile infrared sensors array having a high fill factor and a low noise equivalent temperature difference (NETD) and method of manufacturing the same.

2. Description of the Related Art

Thermocouples have been widely used for temperature measurement. By heating a junction between two conductors, a temperature difference between the junction and a portion located away from the junction is produced, thereby generating a diffusion current. A reverse electromotive force (also called the Seebeck voltage) is, therefore, corresponding to compensate the diffusion current. By measuring the Seebeck voltage, the temperature difference between the two ends of the thermocouple can be obtained. The value of the Seebeck voltage is determined from the product of the temperature difference between the two ends of the thermocouple and the Seebeck coefficient of the two conductors forming the thermocouple. Furthermore, the thermally generated voltage can be amplified by connecting plural pairs of thermocouples in series to form a thermopile. Therefore, the Seebeck voltage of the thermopile is equal to a value that is obtained from the product of the Seebeck voltage of a single thermocouple and the number of the thermocouples in series.

From 1980, with the development of silicon micromachining technologies, both the responsivity (V/W) and the response speed of the thermopile sensor is greatly increased by a suspending membrane structure that is capable of lowering its thermal capacitance and has a high thermal isolation effect (low thermal conductance). As a result, various high performance thermopile sensors are well developed.

In addition to a single sensor fabrication, it is also possible to manufacture a monolithic sensors array, mainly a infrared focal plane array (IRFPA) for thermal imaging in the fields of military detection systems, the automotive industry medicine, industrial automation and home security monitoring.

An advantage of a thermopile sensor is that it does not need a power supply. Thus, it rejects the noise voltage against the power source, which other thermal sensors such as a bolometer suffers from. Moreover, because the current flowing through the thermopile sensor is very small or even zero, a low frequency noise (1/f noise) caused by the driving current can also be ignored. Because thermopiles detect the temperature difference between the hot and the cold junctions, and because the cold junction is located on the heat reservoir, the cold junction plays the important role as the temperature reference. Therefore, the thermopile does not need temperature stabilization, whereas bolometers generally do. At the same time, the thermopile sensor does not need a chopper, whereas pyroelectric sensors do.

FIG. 1 is a locally enlarged schematic illustration showing a conventional thermopile infrared sensors array as disclosed by Kanno et al. in "Uncooled infrared focal plane array having 128×128 thermopile detector elements." It should be noted that only one complete thermopile sensor 10 is shown in FIG. 1.

Referring to FIG. 1, the thermopile sensor 10 includes a substrate 100 and a suspending membrane 101 that is formed on the substrate 100 and has a plurality of thermocouples 102. A hot junction 103 is located at the central portion of the suspending membrane 101, while a cold junction 104 is located on the peripheral portion of the suspending membrane 101 attached to the substrate 100 that acts as a heat reservoir. A plurality of etching windows 105 are formed on the suspending membrane 101. A polysilicon sacrificial layer (not shown) under the suspending membrane 101 can be etched via the etching windows 105 to construct a suspending structure. The structure of the thermopile sensor 10 will be better understood with reference to the cross-section view taken along a line 2—2.

FIG. 2 is a cross-section view taken along the line 2—2 as shown in FIG. 1. Referring to FIG. 2, the thermopile sensor 10 includes a substrate 100 and a suspending membrane 101. The substrate 100 includes an integrated circuit 107. Furthermore, a concavity 106 is formed between the suspending membrane 101 and the substrate 100. The suspending membrane 101 includes a first dielectric layer 108, a P-type polysilicon 102a, a second dielectric layer 109, an N-type polysilicon 102b, a third dielectric layer 110, and a metallic wiring 102c. The metallic wiring 102c connects the P-type polysilicon 102a with the N-type polysilicon 102b. A thermocouple 102 is composed of the P-type polysilicon 102a, the N-type polysilicon 102b, and the metallic wiring 102c. It should be noted that the regions of both the hot junction 103 and the cold junction 104 are also shown in this figure.

The thermopile infrared sensors array disclosed in Reference 1 is composed of 128×128 thermopile sensors 10 arranging in an array form, the specifications of which are as follows:

pixel size: (100×100) $\mu m^2$;

suspending membrane area: (80×84) $\mu m^2$;

fill factor: 67% thermocouple: 32 pairs;

responsivity: 1550 V/W (in a vacuum environment); and

NETD (noise equivalent temperature difference): 0.5° C.

The high performance of this cited example is due to the manufacturing processes of the sensors array are compatible with standard IC processing. Furthermore, the signals produced by these sensors are amplified through the corresponding integrated circuit 107. Therefore, a relatively high responsivity (1550 V/W) can be obtained. In addition, a sacrificial layer technology has been adopted to reach a high fill factor of 67%. Nevertheless, compared to the bolometric FPA (focal plane array) that has reported a low NETD of 0.039° C., the sensitivity of this thermopile FPA is still not enough.

In order to improve the thermopile performance, the basic physics of this sensor should be analyzed first. FIG. 3 is a schematic illustration showing a simplified infrared imaging system, in which thermal radiation irradiated from an object 120 is absorbed by a thermopile sensor 122 via an optical system 121.

In an idealized situation, that is, assuming that there is no optical absorption by the delivery medium and the optical system 121, NETD is given by Equation (1):

$$NETD = \frac{4F^2 Vn}{RvAsL} = \frac{4F^2}{AsL} NEP \quad (1)$$

wherein "As" is the effective absorbing area of thermal radiation on the thermopile sensor 122; "Vn" is the total noise voltage within the system bandwidth; "Rv" is the responsivity; "F" is the focal ratio of the optical system 121; "NEP" is the noise equivalent power, the value of which is Vn/Rv; and "L" is the change in power per unit area radiated by the object 120 within a spectral band.

NETD which is defined as the change in temperature of the object 120 that will cause the signal-to-noise ratio at the output of the thermopile sensor 122 and its read-out electronic s to change by unity. Usually, NETD is used to judge the figure of merit of an infrared imaging system, and its value is lower to better The responsivity Rv of the above thermopile sensor is represented by Equation (2):

$$R_v = \frac{\eta N \alpha}{Gs + Gg + Gr} \quad (2)$$

wherein "η" is the absorption of the incident radiation, "N" is the number of thermocouples connected in series, "α" is the Seebeck coefficient (V/° C.) of each thermocouple, and "Gs", "Gg", and "Gr" are the solid, gas, and radiation thermal conductance, respectively, of the suspending membrane structure of the thermopile sensor.

For a thermopile, "Vn" is mainly dominated by the Johnson noise; it is represented by Equation (3):

$$Vn = \sqrt{4kTsR\Delta f} \quad (3)$$

wherein "k" is the Boltzmann constant, "Ts" is the temperature (K) of the thermopile sensor, "R" is the resistance of the thermocouple, and "Δf" is the system bandwidth.

From the viewpoint of sensor architecture, it is easily understood from the Equation (1) that a lower value of NEP should be the most desired result when the sensor area As is fixed. That implies either to increase the responsivity Rv or to reduce the noise voltage Vn, even to increase Rv and to reduce Vn simultaneously. Nevertheless, there is a strong relation between these two factors Rv and Vn. Because the total resistance R depends on each couple's Seebeck coefficient α and number N, and is inversely dependent upon solid conductance Gs. That makes the situation rather sophisticated to resolve.

SUMMARY OF THE INVENTION

It is therefore an object of the invention to provide a low NETD thermopile infrared sensors array with a new sensor structure having hidden thermocouple cantilever beams, and a large fill factor. A method for manufacturing the sensor is also provided.

In accordance with one aspect of the invention, a thermopile infrared sensor includes a substrate, at least one thermocouple beam, and a suspending membrane. The thermocouple cantilever beam is formed above the substrate. The thermocouple cantilever beam has a first end and a second end located away from the first end. The first end is attached to the substrate to form a cold junction. A predetermined distance is formed between the second end and the substrate. The suspending membrane is formed above the thermocouple cantilever beam and is attached to the second end of the thermocouple cantilever beam to form a hot junction. The thermocouple cantilever beam is hidden underneath or covered by the suspending membrane.

In accordance with another aspect of the invention, a thermopile infrared sensors array is composed of a plurality of thermopile sensors each including a substrate, at least one thermocouple cantilever beam, and a suspending membrane. The thermocouple cantilever beam is formed above the substrate. The thermocouple cantilever beam has a first end and a second end located away from the first end. The first end attaches to the substrate to form a cold junction. A predetermined distance is formed between the second end and the substrate. The suspending membrane is formed above the thermocouple cantilever beam and is supported by the second end of the thermocouple cantilever beam to form a hot junction. The thermocouple cantilever beam is hidden under the suspending membrane.

The above thermopile sensor may further include an integrated circuit formed in the substrate and electrically connected with the at least one thermocouple cantilever beam to perform a predetermined processing to an output signal from the at least one thermocouple beam. In addition, the at least one thermocouple cantilever beam may include a thermocouple composed of an N-type and a P-type polysilicon conductor or composed of a polysilicon conductor and a metallic conductor.

In accordance with still another aspect of the invention, a method for manufacturing a thermopile infrared sensor comprising the steps of: forming at least one thermocouple and a first sacrificial layer on a substrate; forming a second sacrificial layer on both of the thermocouple and the first sacrificial layer, and a via hole on the second sacrificial layer to expose a part of the at least one thermocouple; forming a dielectric layer on both of the second sacrificial layer and the at least one thermocouple; removing periphery portions of the dielectric layer to expose periphery portions of the second sacrificial layer; etching the second sacrificial layer and the periphery portions of the first sacrificial layer to form undercuts under the dielectric layer; forming a black absorber on the dielectric layer by way of self-deposition; etching the second sacrificial layer and the first sacrificial layer through the undercuts to form a suspending membrane and expose a part of the substrate, wherein the suspending membrane is composed of the dielectric layer and the black absorber; and etching a predetermined portion of the substrate tinder the at least one thermocouple by way of anisotropic etching technology to form the at least one thermocouple beam in a cantilever form.

BRIEF DESCRIPTION OF THE DRAWINGS

FIGS. 9A through 9I are cross-section views showing the thermopile infrared sensors array in accordance with a preferred embodiment of the invention, in an order of the manufacturing processes.

DETAILED DESCRIPTION OF THE INVENTION

The basic theory of the invention will be described in detail in the following.

In order to lower the figure of merit of NETD, how to reduce the NEP value is the key point of this invention. Let's reconsider the equation (2) in a more realistic condition, that is, a thermal FPA is usually packaged in a vacuum environment to boost its performance, thus the gas conductance Gg is neglected. Besides, as a 2-D FPA application, the pixel size is practically 50~150 μm. Then the corresponding radiation conductance is amid $1 \times 10^{-8}$ W/K~$1 \times 10^{-7}$ W/K at room temperature. It is also rather small compared to the solid conductance Gs. Therefore, this equation can be rewritten in the following form:

$$Rv = \frac{\eta N \alpha}{Gs}. \quad (4)$$

Furthermore, the total solid conductance Gs can be averaged and is equivalent to a value obtained by a product of a solid conductance Gsingle of a single thermocouple and the number N of thermocouples. Therefore, Equation (4) can be rewritten as:

$$Rv = \frac{\eta \alpha}{Gsingle}. \quad (5)$$

Equation (5) is the basis of the invention. It is easily understood from Equation (5) that the value of Rv is determined by the characteristics of a single thermocouple including its Seebeck coefficient and solid conductance. Lowering down the number N even to 1 does not affect the Rv but obtaining one important advantage of reducing the total resistance R. Then, the Johnson noise voltage can be reduced and a relatively low NEP is thus obtained. This concept is totally different from the others' reports including the cited prior art that always using a large number N of thermocouples to raise the numerator of Equation (2), whereas ignoring the increase of total resistance. Besides, a fill factor should also be considered regarding to a two-dimensional sensors array. The fill factor is defined as a sensor area/a pixel area of a 2-D sensors array. An sensors array with a higher fill factor means that when fixing the number of pixels, a sensors array with a smaller chip area can be manufactured, or when fixing the chip size, a denser sensors array with more pixels can be manufactured. Taking the fill factor into account, Equation (1) is rewritten as:

$$NETD = \frac{4F^2}{A \cdot f\!f \cdot L} NEP \quad (6)$$

wherein "A" is the averaged pixel area of a sensor in the sensors array, "ff (=As/A)" is the fill factor. Thus, when the pixel area As keeps the same, NETD decreases as the fill factor increases. Reconsider the spirit of this invention of Equation (5), not just a low NEP can be achieved, a larger fill factor is accompanied with less space occupied by fewer number of thermocouples.

Hence, it is an object of the invention to provide a thermopile infrared sensors array having a low NEP and a high fill factor.

Preferred embodiments of the invention will be described in detail with the reference to the accompanying drawings.

Figure 1:
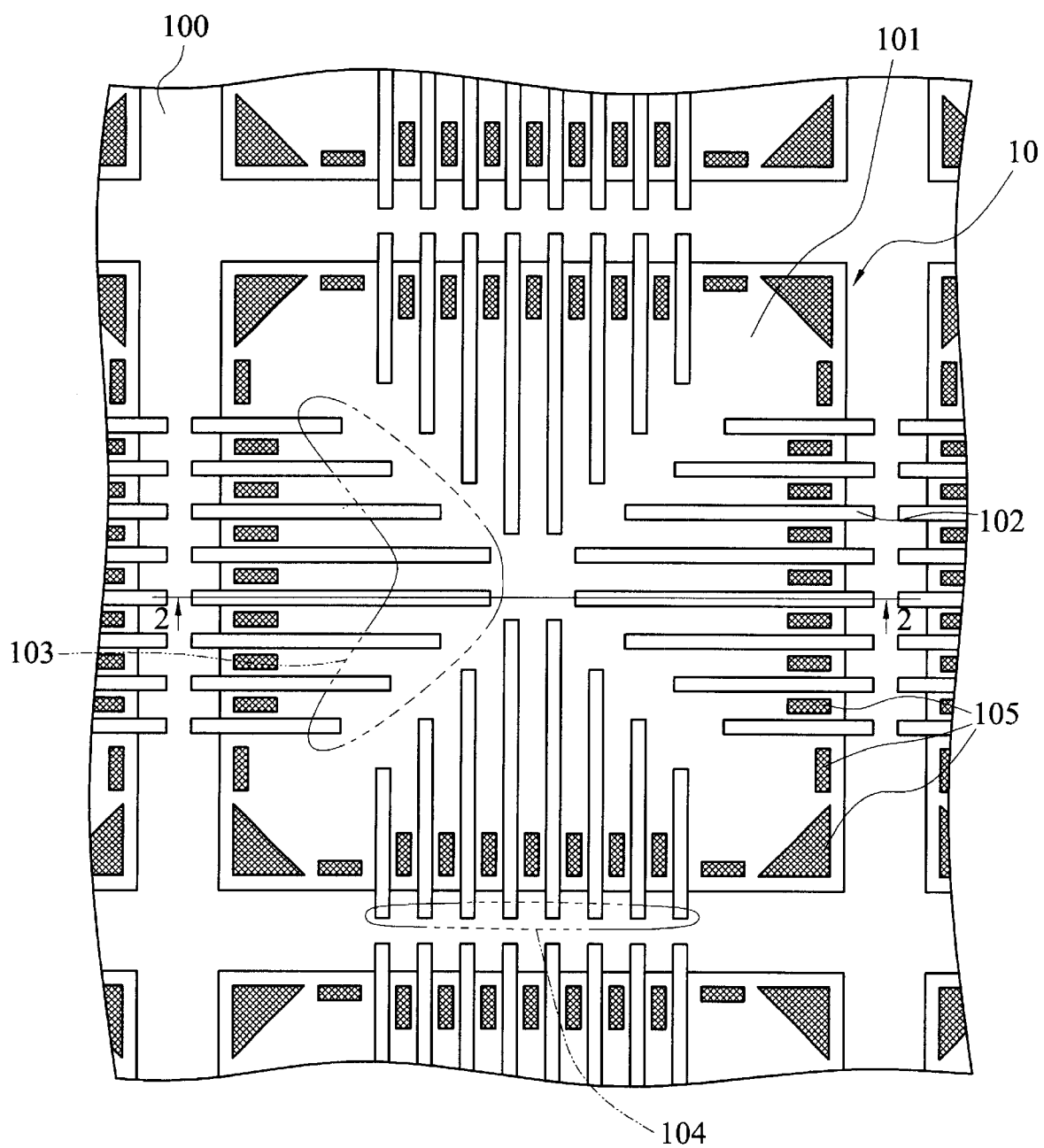
FIG. 1 is a schematic illustration showing one thermopile sensor of a conventional thermopile infrared sensors array.
Figure 2:
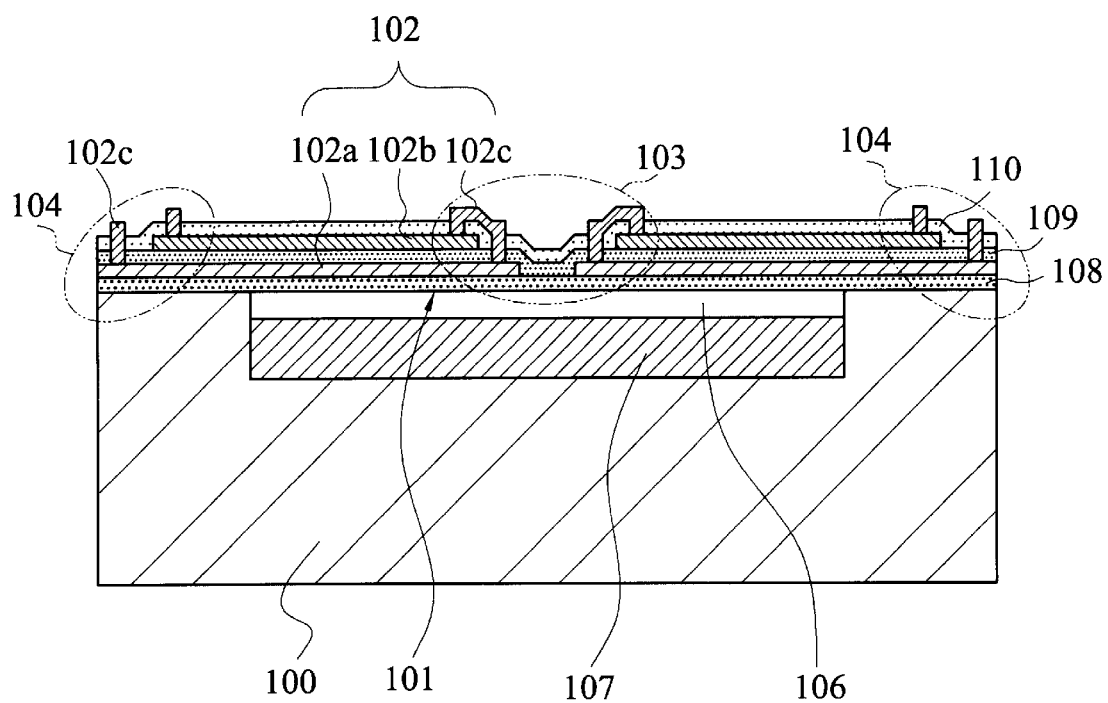
FIG. 2 is a cross-section view taken along a line 2—2 as shown in FIG. 1.
Figure 3:
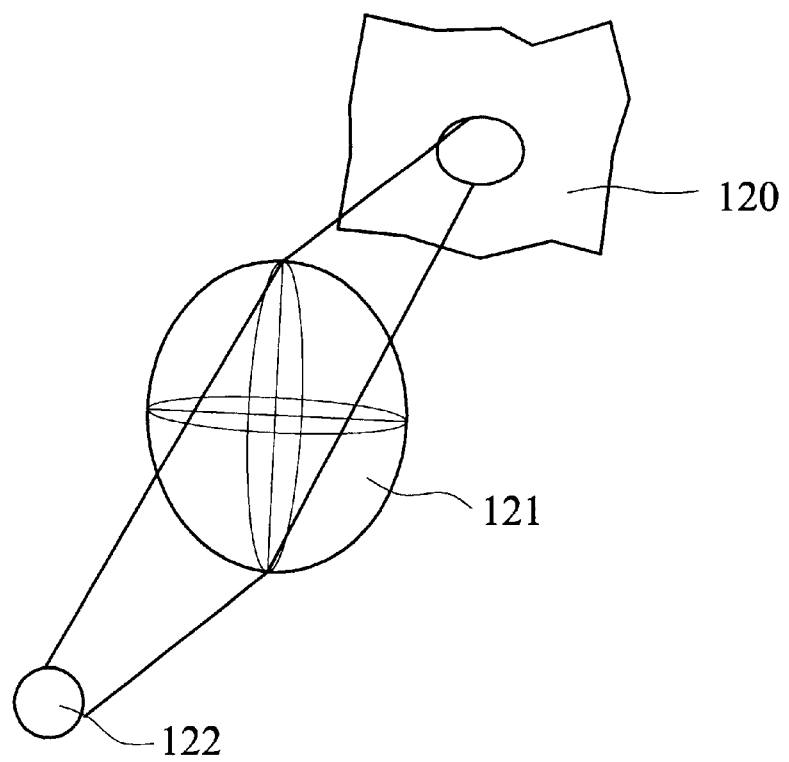
FIG. 3 is a schematic illustration showing the infrared radiation from an object 120 being absorbed by a thermopile sensor 122 via an optical system 121.
Figure 4A:
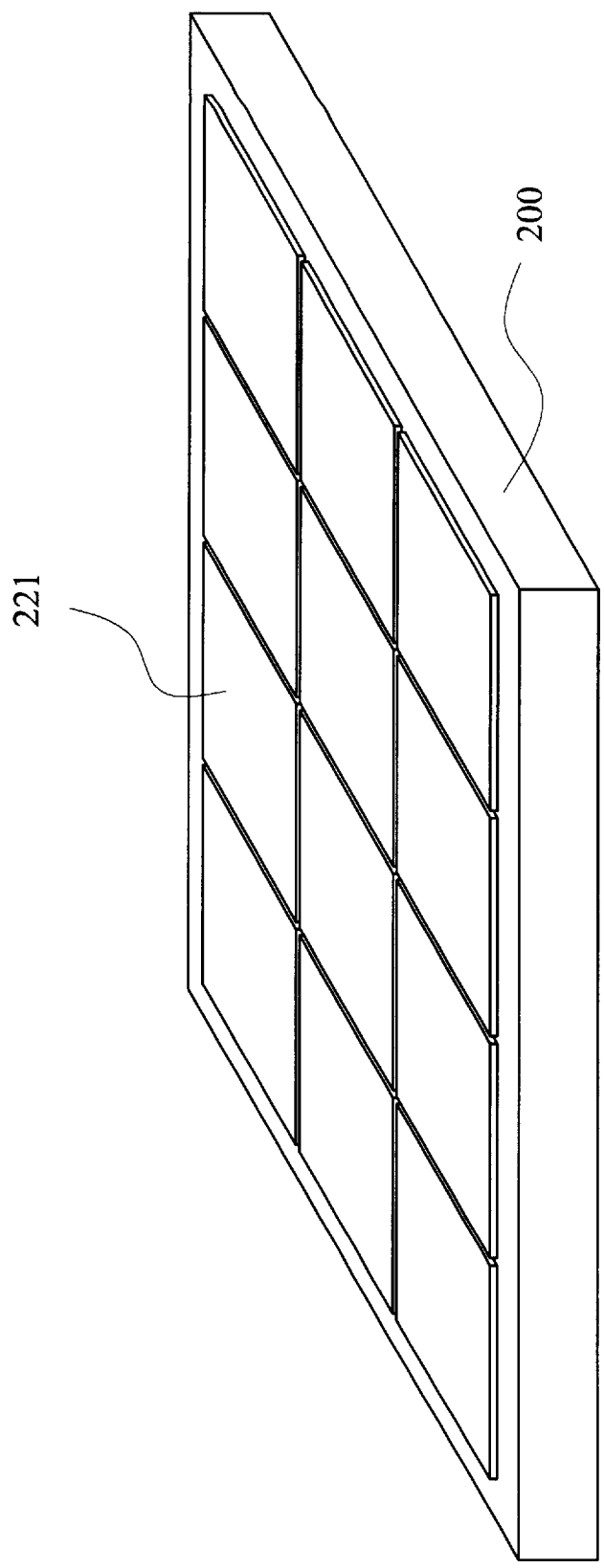
FIG. 4A is a pictorial view showing a thermopile infrared sensors array in accordance a preferred embodiment of the invention.
Figure 4B:
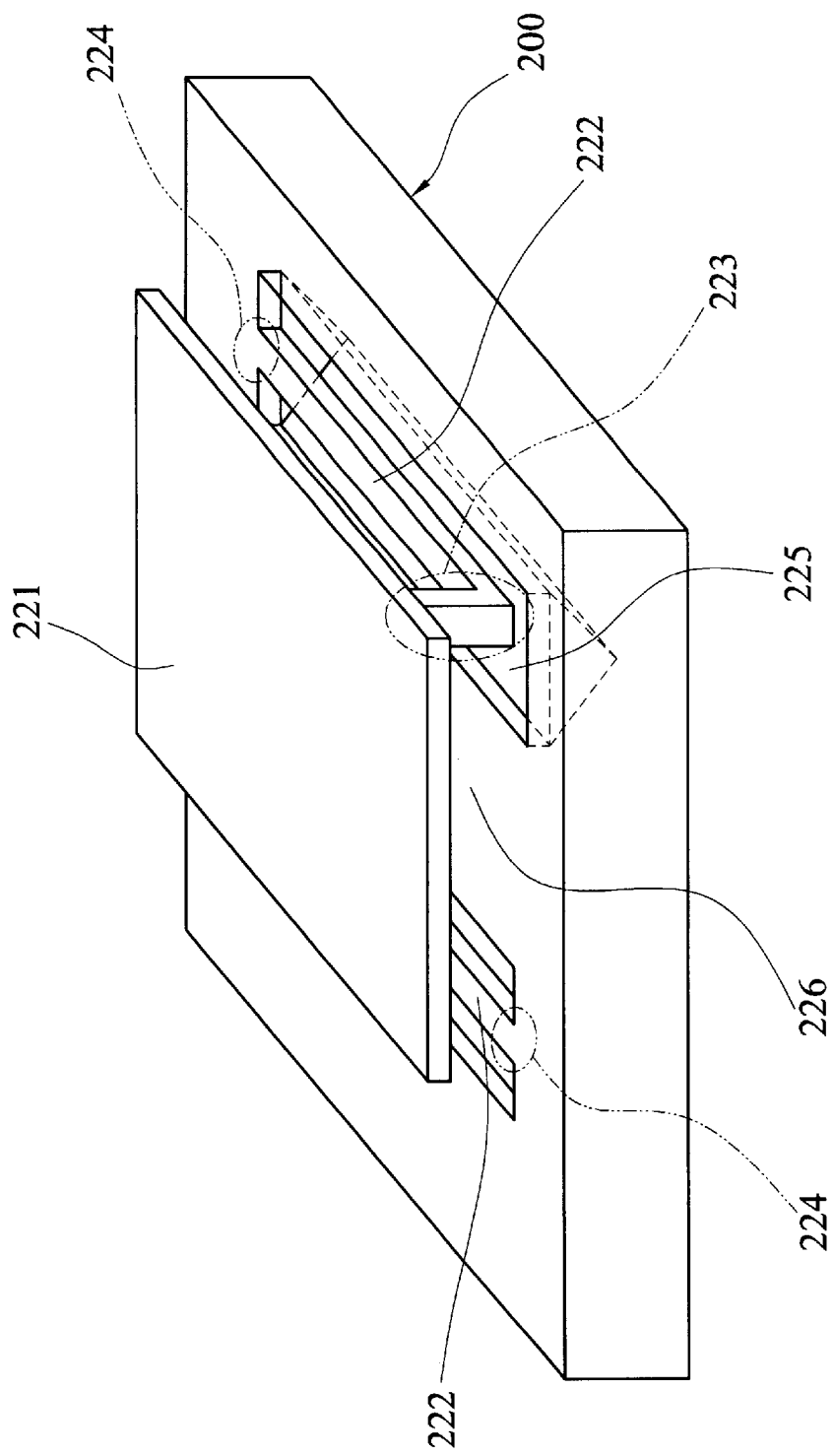
FIG. 4B is a pictorial view showing a thermopile sensor as shown in FIG. 4A.

FIG. 4A is a pictorial view illustrating a thermopile infrared sensors array in accordance with a preferred embodiment of the invention. FIG. 4B is a pictorial view illustrating a single thermopile sensor. The thermocouple cantilever beam is hidden under the suspending membrane.

Referring to FIG. 4A, the thermopile infrared sensors array includes a substrate 200 and a plurality of suspending membranes 221. The suspending membranes 221 are arranged in an array form. For illustrating the structure of a single thermopile sensor more clearly, a detailed description with reference to FIG. 4B will be made hereinbelow.

Referring to FIG. 4B, the thermopile sensor includes a substrate 200, a suspending membrane 221, and two thermocouple cantilever beams 222. An integrated circuit 226 is formed on the substrate 200 below the suspending membrane 221. A black absorber (not shown) is provided on the suspending membrane 221 for absorbing thermal radiation. The suspending membrane 221 is supported by the two thermocouple cantilever beams 222. The suspending membrane 221 and one end of each of the two thermocouple cantilever beams 222 is connected in a hot junction 223, while the substrate 200 and another of each of the two thermocouple cantilever beams 222 is connected in a cold junction 224. A concavity 225 is formed under and around the two thermocouple cantilever beams 222.

Figure 5:
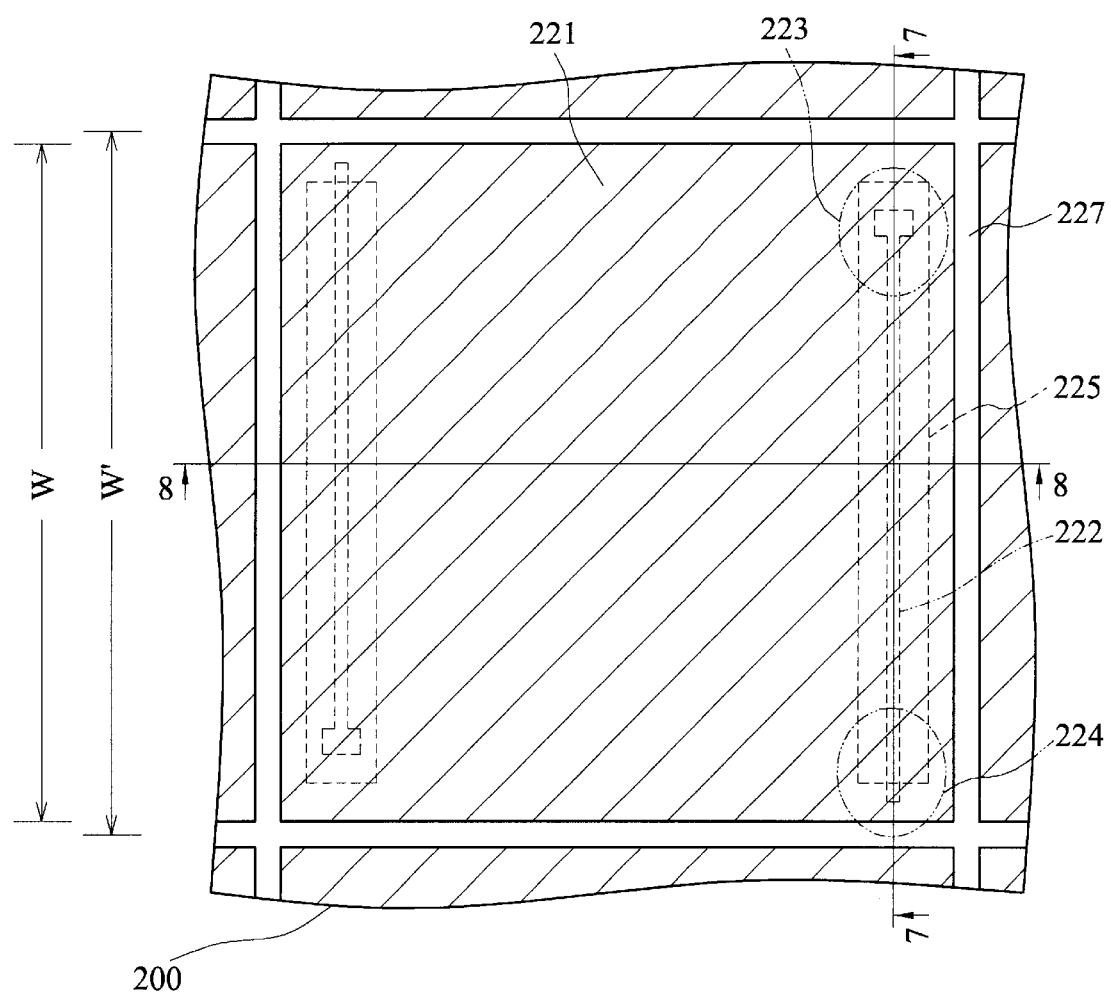
FIG. 5 is a partial top view showing a thermopile infrared sensors array in accordance with the preferred embodiment of the invention.

FIG. 5 is a locally enlarged top view showing the thermopile infrared sensors array in accordance with a preferred embodiment of the invention. Referring to FIG. 5, the suspending membranes 221 are supported above the substrate 200 and arranged in an array form. An etching window 227 is defined in a dielectric layer etching step so as to etch an sacrificial layer (not shown) under the suspending membrane 221 through the etching window 227. The thermocouple cantilever beams 222 are hidden under or completely hidden underneath or covered by the suspending membranes 221 for supporting the suspending membranes 221. In a case in which the width of each of the suspending membranes 221 is W and the width of a single thermopile sensor pixel is W', the fill factor is ($W^2/W'^2$). Using the thermopile infrared sensors array of the invention, in the case that the area of each of the suspending membranes 221 is 48×48 μm$^2$, the pixel area is 50×50 μm$^2$, the fill factor can reach as high as 92%.

Because the thermocouple cantilever beams 222 are located under the suspending membrane 221, the fill factor ($W^2/W'^2$) of the thermopile infrared sensors array greatly increases. On the other hand, due to the thermocouple cantilever beams 222 hidden under the suspending membranes 221, the solid thermal conductance can be decreased to increase the responsivity Rv of the sensor by changing the shapes of the extending thermocouple cantilever beams without changing the fill factor. For example, referring to FIG. 6, which is a locally enlarged top view showing a thermopile infrared sensors array in accordance with another preferred embodiment of the invention, the thermocouple cantilever beams 222 are designed to have longer serpentine shape.

Figure 6:
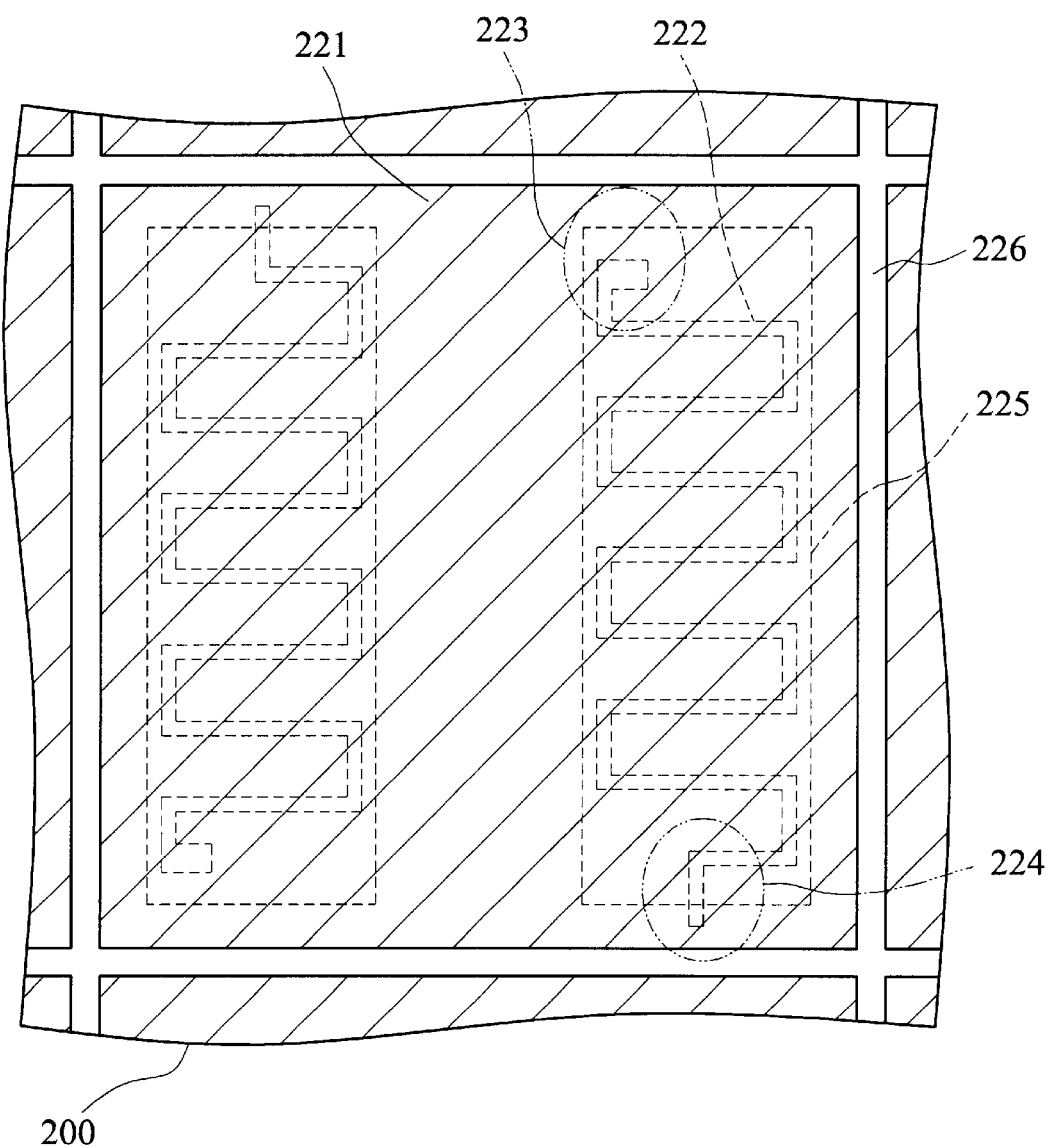
FIG. 6 is a partial top view showing a thermopile infrared sensors array in accordance with another preferred embodiment of the invention.

It should be noted that the inner structure of the thermocouple cantilever beam 222 as shown in FIG. 5 and FIG. 6 is the same except for the shapes of the extending thermocouple cantilever beams 222 .

The detailed structure of the thermopile infrared sensors array of the invention will be described with reference to a cross-section view taken alone a line 7—7 as shown in FIG. 5.

Figure 7:
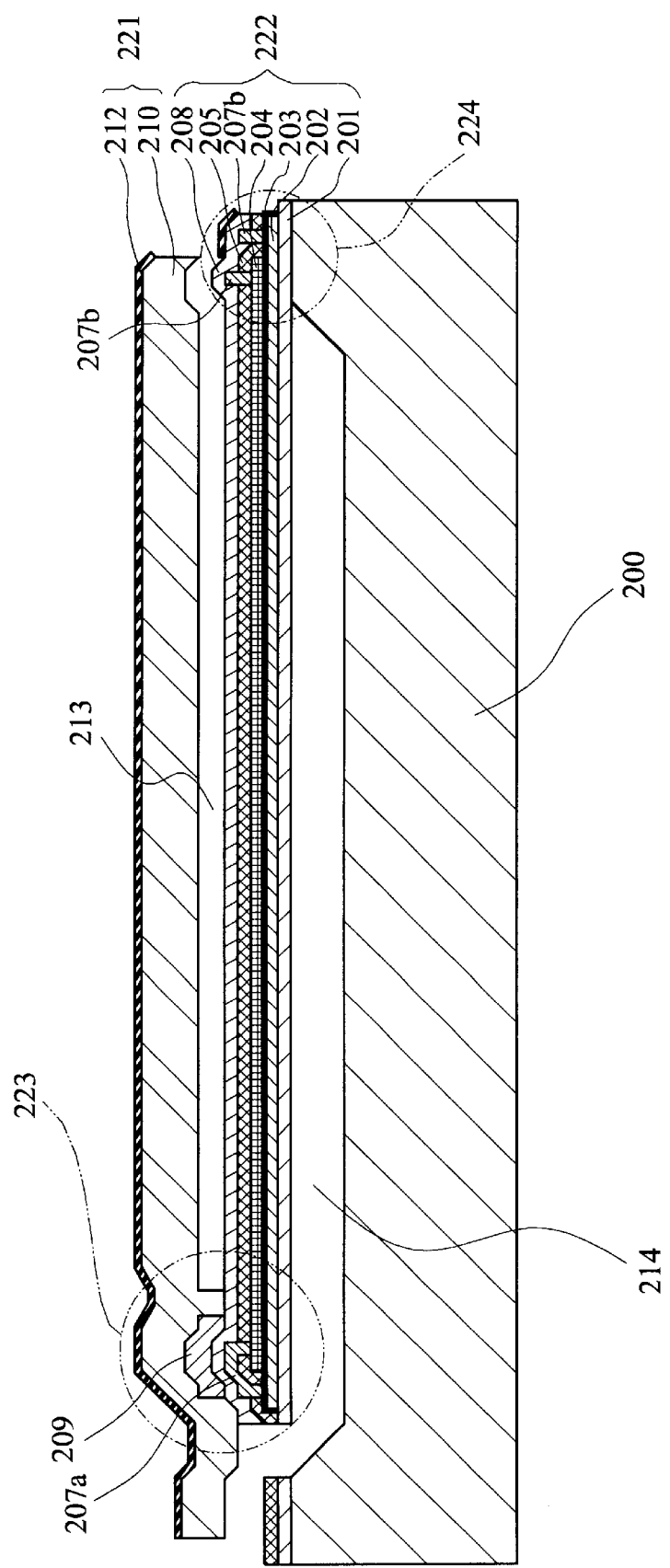
FIG. 7 is a cross-section view taken along a line 7—7 as shown in FIG. 5.

FIG. 7 is a cross-section view taken along a line 7—7 as shown in FIG. 5. Referring to FIG. 7, the thermopile sensor includes a substrate 200, a thermocouple cantilever beam 222, and a suspending membrane 221. A first gap 213 is formed between the thermocouple cantilever beam 222 and the suspending membrane 221. A second gap 214 is formed between the substrate 200 and the thermocouple cantilever beam 222. A cold junction 224 is formed in a contact region between the thermocouple cantilever beam 222 and the substrate 200. A hot junction 223 is formed in a contact region between the suspending membrane 221 and the thermocouple cantilever beam 222.

The thermocouple cantilever beam 222 includes a first dielectric layer 201, a N-type polysilicon conductor 202, a second dielectric layer 203, a P-type polysilicon conductor 204, a third dielectric layer 205, and a fourth dielectric layer 208, all of which are formed above the substrate 200 in their order of listing. Both the N-type polysilicon conductor 202 and P-type polysilicon conductor 204 in the hot junction 223 are electrically connected to each through a first metal wiring layer 207a. On the other hand, the N-type polysilicon conductor 202 and P-type polysilicon conductor 204 in the cold junction 224 are electrically connected to a P-type polysilicon conductor and an N-type polysilicon conductor of an adjacent thermocouple cantilever beam (not shown) through a first metal wiring layer 207b.

The suspending membrane 221 includes a dielectric layer 210 and a black absorber 212 for absorbing infrared radiation so as to produce a temperature rise on the suspending membrane 221. In this case, the suspending membrane 221 is the hot junction 223. From a macroscopic viewpoint, the suspending membrane 221 can be regard as an isothermal plane. Therefore, a temperature difference between of the hot junction 223 and the cold junction 224 is produced, and an electromotive force is generated. The electromotive force is processed through the integrated circuit 226 and output to an external circuit (not shown).

Figure 8:
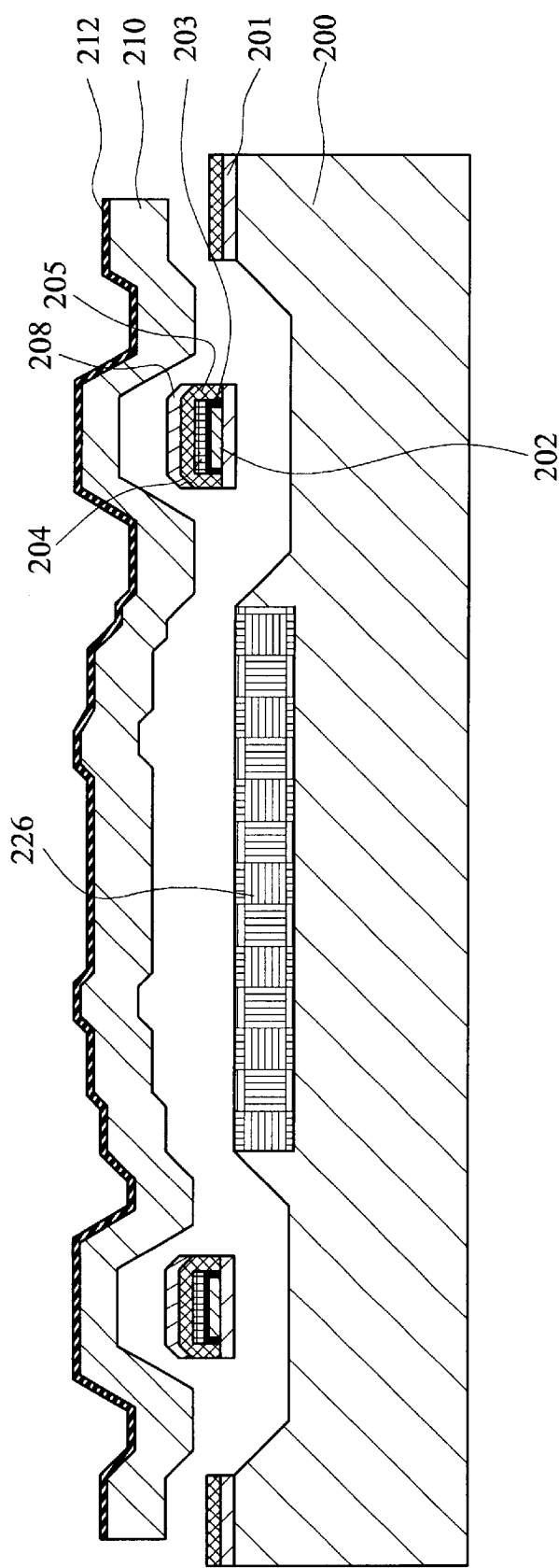
FIG. 8 is a cross-section view taken along a line 8—8 as shown in FIG. 5.

FIG. 8 is a cross-section view taken along a line 8—8 as shown in FIG. 5. Referring to FIG. 8, the structure of the thermocouple cantilever beam 222 hidden under the suspending membrane 221 will be easily understood. It should be noted that in addition to the integrated circuit 226, the other elements have been shown in FIG. 7, and a detailed description of them is omitted. An advantage of such a structure is that the sensor has a low NEP and a high fill factor. Another advantage of the structure is that the sensor and the integrated circuit can be formed vertically integrated with each other, i.e., the integrated circuit can be directly formed under the suspending membrane to increase the fill factor.

As a result, the cross-section of the thermopile sensor taken along the line 7—7 as shown in FIG. 5 is of an S-shape. The manufacturing processes of the thermopile sensor will be described in the following.

FIGS. 9A through 9I are cross-section views showing the thermopile infrared sensors array in accordance with a preferred embodiment of the invention, in order of the manufacturing processes. Referring to FIGS. 9A through 9I, the manufacturing processes of the thermopile infrared sensors array of the invention are described in the following.

Figure 9A:
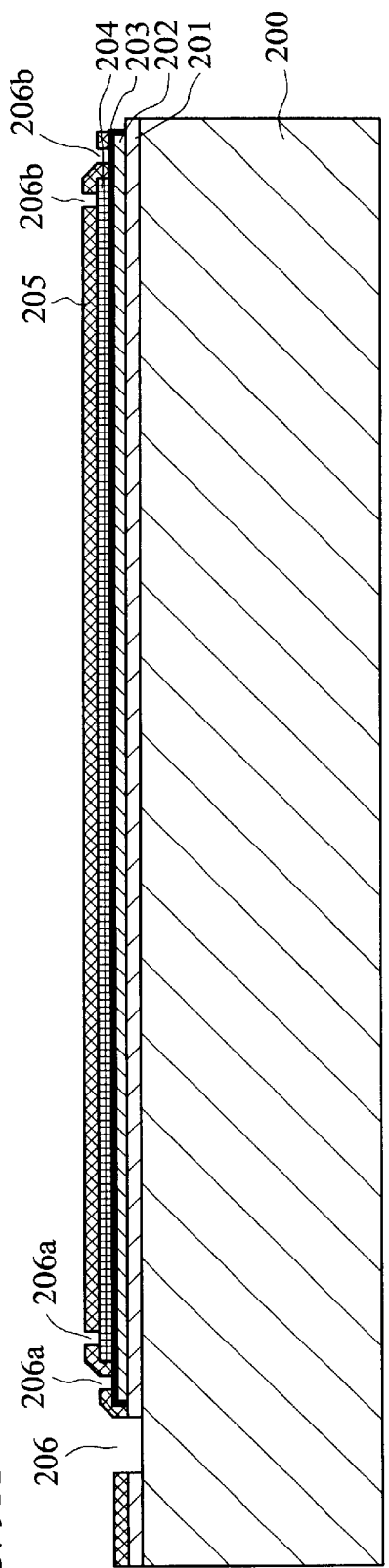

(1) First, referring to FIG. 9A, a substrate 200 on which a first dielectric layer 201, an N-type polysilicon conductor 202, a second dielectric layer 203, a P-type polysilicon conductor 204, and a third dielectric layer 205 are formed is provided. A via hole 206 penetrates the third dielectric layer 205 and the first dielectric layer 201. A first wiring via hole 206a and a second wiring via hole 206b penetrates the third dielectric layer 205 to expose parts of the substrate 200, the N-type polysilicon conductor 202, and the P-type polysilicon conductor 204.

Figure 9B:
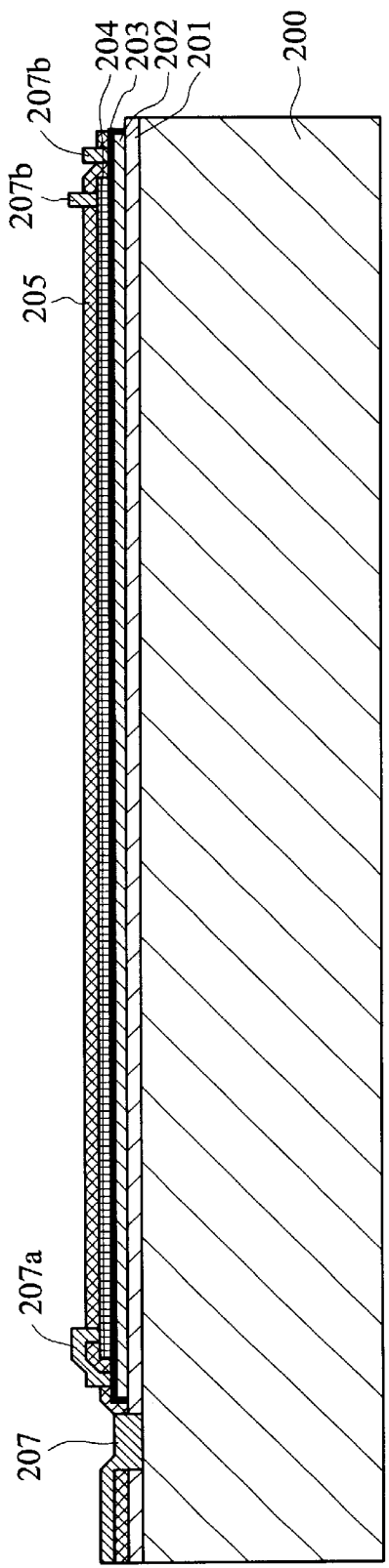

(2) Next, referring to FIG. 9B, a first metal wiring layer 207 (an aluminum material is used as the first metal wiring layer 207 in the embodiment) is deposited to fill the via hole 206, the first wiring via hole 206a, and the second wiring via hole 206b, and to make the P-type polysilicon conductor 204 and the N-type polysilicon conductor 202 electrically connected to each other.

Figure 9C:
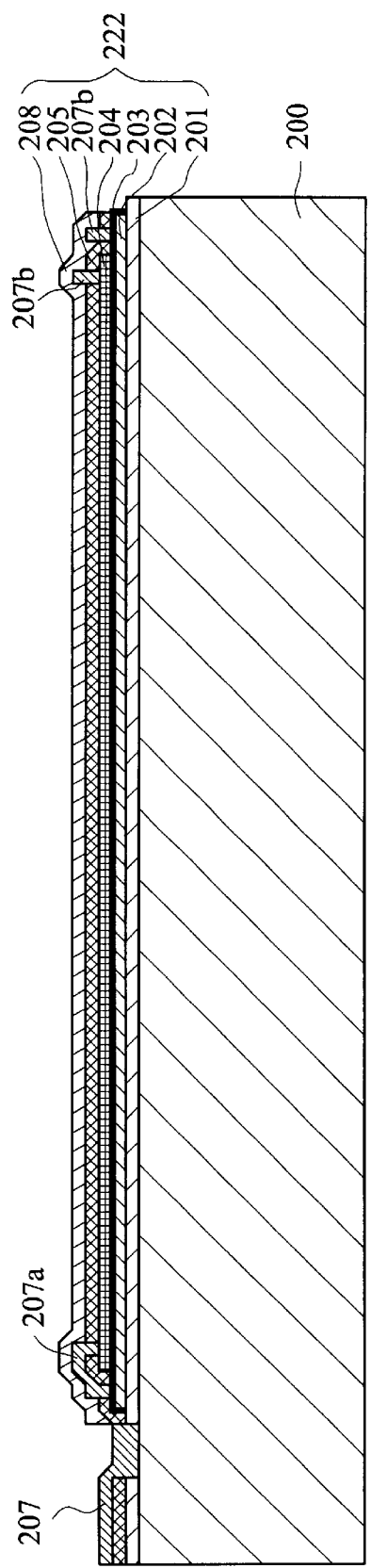

(3) Then, referring to FIG. 9C, a fourth dielectric layer 208 is deposit and a predetermined portion of the fourth dielectric layer 208 is removed.

Figure 9D:
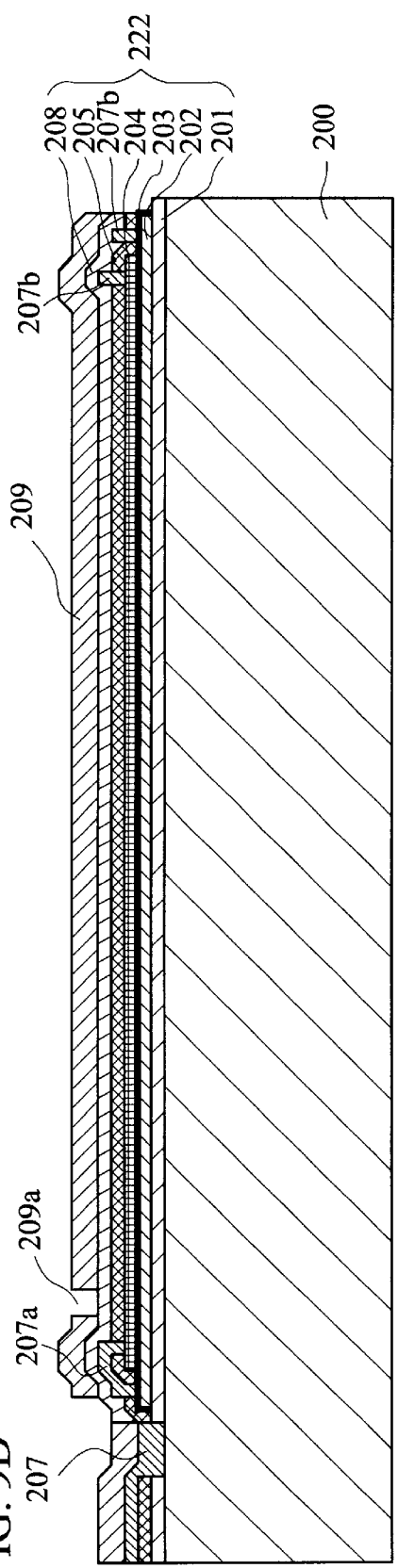

(4) Next, referring to FIG. 9D, a second metal wiring layer 209 is deposited as a sacrificial layer on the fourth dielectric layer 208 and the first metal wiring layer 207 and part of the first metal wiring layer 207 is removed to form a via hole 209a.

Figure 9E:
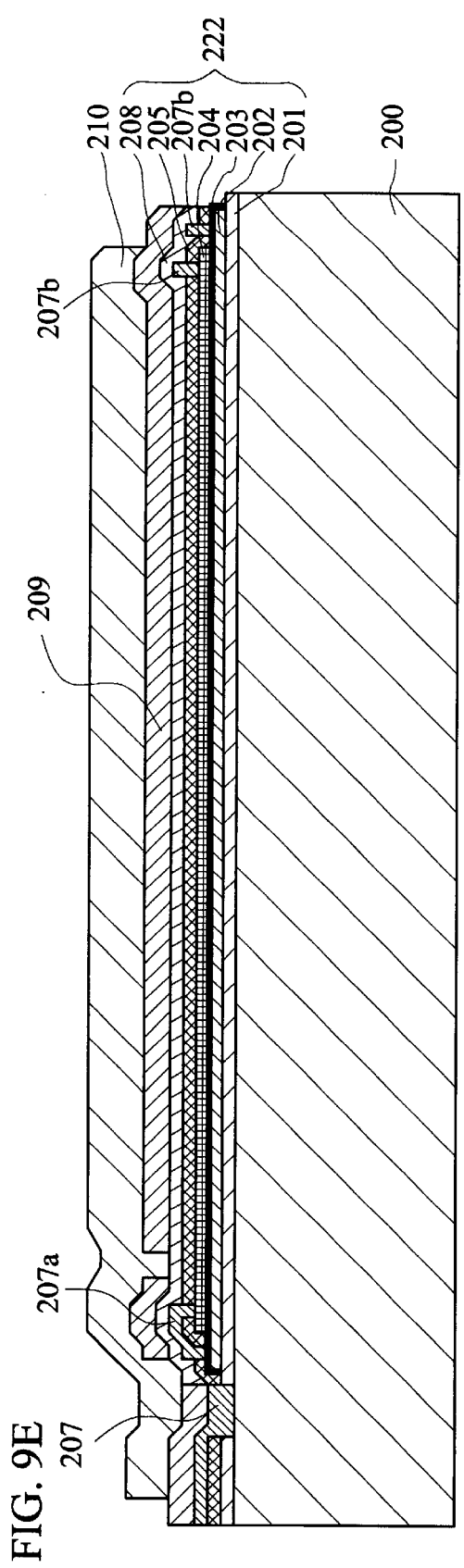

(5) Then, referring to FIG. 9E, a dielectric layer 210 is deposited on the second metal wiring layer 209 to fill the via hole 209a, and remove periphery portions of the dielectric layer 210.

Figure 9F:
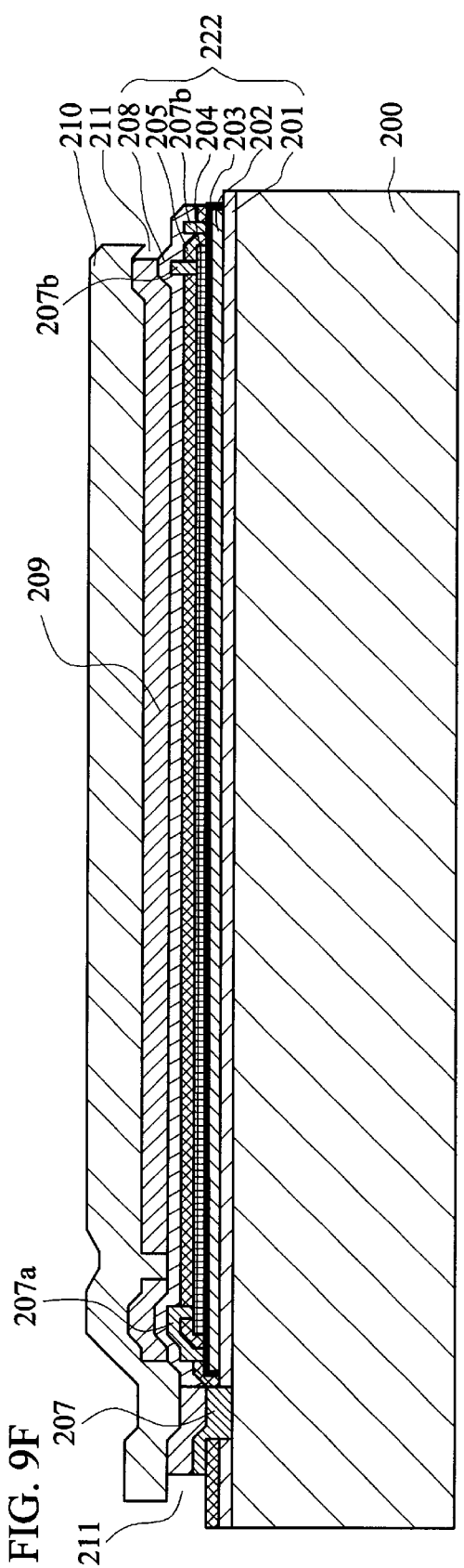

(6) Next, referring to FIG. 9F, the periphery second metal wiring layer 209 and first metal wiring layer 207 are selectively etched to form undercuts 211 which are the core technology of the next process. It should be noted that in this embodiment, the etchant could be a general commercial etchant for aluminum.

(7) Then, referring to FIG. 9G, a black absorber 212 having a thickness of tens to hundreds of angstroms and made of, for example, a radiation absorbing material of a gold black, platinum black, or Ni—Cr, is formed by a self-deposition technology without the additional masking processes. A part of the black absorber 212 formed on the first metal wiring layer 207 can be easily removed when the first metal wiring layer 207 serving as the sacrificial layer is etched because the thickness of the black absorber 212 is far less than the thickness (e.g. greater than 1 $\mu$m) of the first metal wiring layer 207.

(8) Next, referring to FIG. 9H, the exposed second metal wiring layer 209 and the first metal wiring layer 207 are etched from the undercuts 211 to form a first gap 213 and to expose the via hole 206.

Figure 9I:
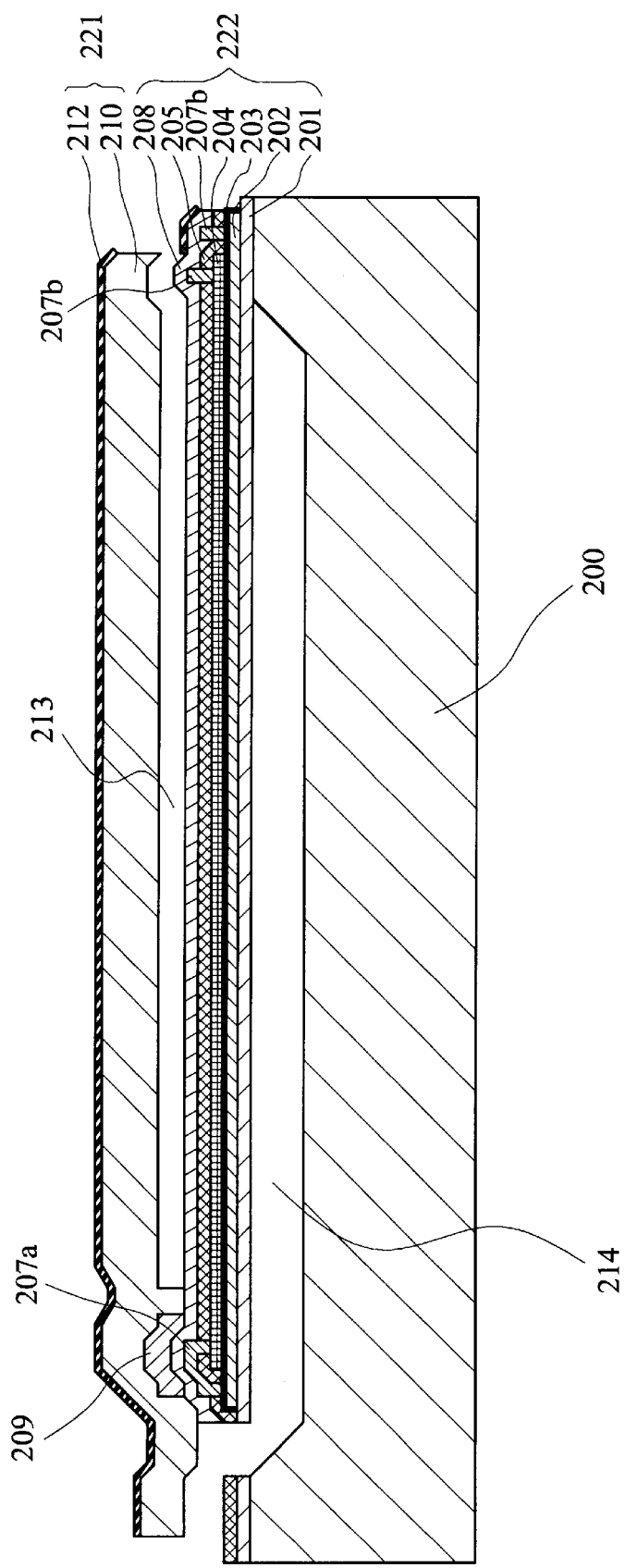

(9) Finally, referring to FIG. 9I, from the via hole 206, parts of the substrates 200 under the thermocouple 222 are removed using the anisotropic etching technology to form a second gap 214 and a suspending cantilever beam structure. The anisotropic etching technology is conducted by removing the silicon substrate at a temperature between 80 and 100° C., and using a hydrazine or TMAH as an etchant, which has a lower etching rate against the dielectric material.

It should be noted that the manufacturing processes in FIGS. 9A to 9C can be summarized as the following, a thermocouple 222, a first metal wiring layer (a first sacrificial layer) 207, and a second metal wiring layer (a second sacrificial layer) 209 are formed on the substrate 200.

From the above manufacturing processes, it is understood that the manufacturing processes suitable for the invention should satisfy the following conditions.

1. Using a silicon material with a crystal direction of (1,0,0) as a semiconductor substrate;
2. Performing at least one polysilicon (P-type or N-type) process and two aluminum interconnecting wiring processes.
3. The two thermocouple materials are an N-type and a P-type polysilicon, a P-type polysilicon and a metallic interconnecting wiring, or an N-type polysilicon and a metallic interconnecting wiring.
4. The materials of all the dielectric layers include all the dielectric materials such as a silicon oxide, a silicon nitride, or a low-k material. Moreover, the planarization processes of the dielectric layers are also included.

Furthermore, the above thermopile infrared sensors array can be manufactured using the commercial-available semiconductor manufacturing processes, so it is advantageous in lowering the manufacturing costs. On the other hand, the self-deposition technology for coating the black absorber is more advantageous in simplifying the manufacturing processes. Moreover, the integrated circuit 226 and the thermocouple cantilever beam 222 are hidden under the suspending membrane 221, causing no unwanted influence when coating the black absorber.

Alternatively, because the concavity 225 formed by anisotropic etching only occupies a small part of the substrate 200 under the suspending membrane 221, a large part of the substrate 200 under the suspending membrane 221 can be used to form an integrated circuit 226 corresponding to each thermopile sensor pixel. The integrated circuit 226 is connected with the thermopile sensor for processing the voltage signal produced from the thermopile sensor. As a result, the thermopile sensor and the integrated circuit can be vertically arranged without wasting the area of the substrate 200, so the fill factor is increased and a monolithic focal plane sensors array can be manufactured.

Figure 10:
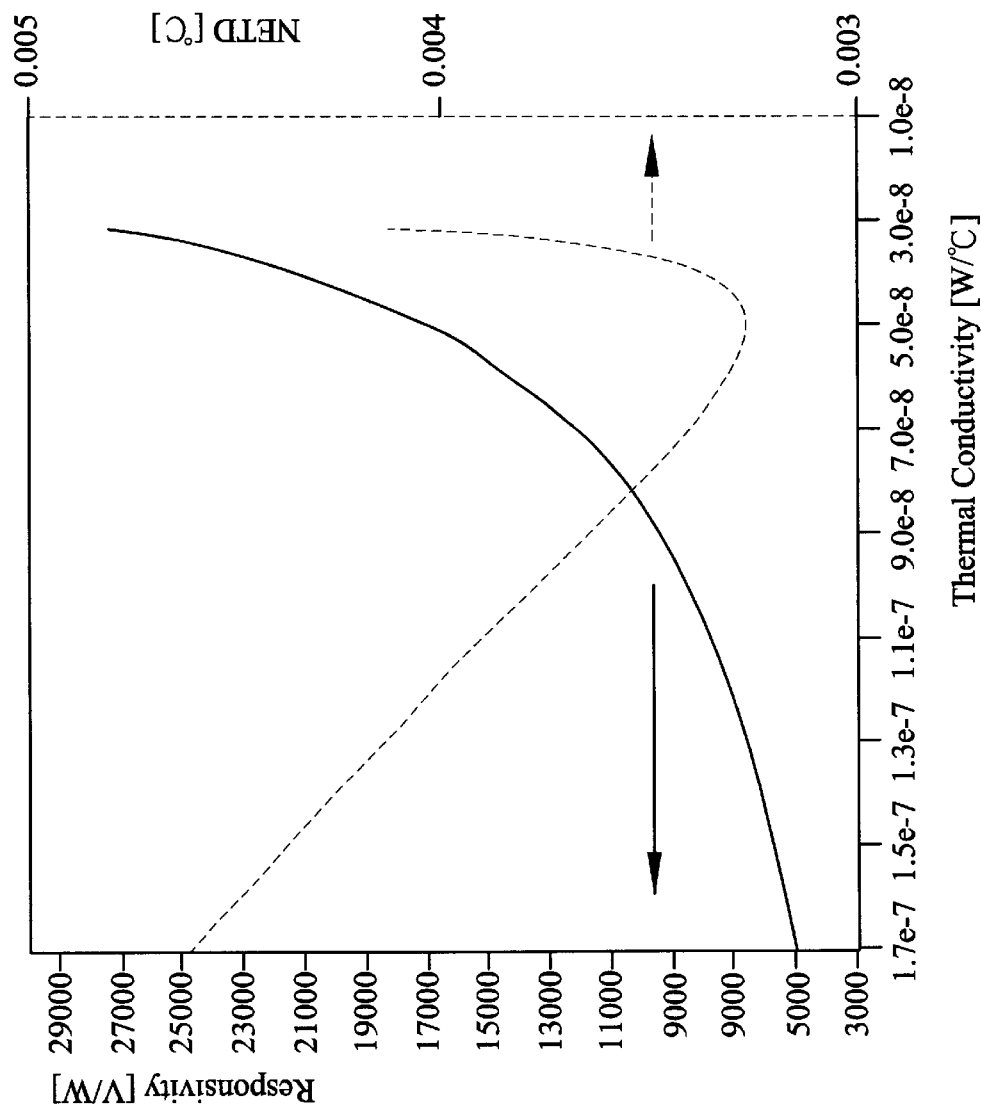
FIG. 10 shows a relationship between NETD and responsivity versus the solid conductance of the thermopile infrared sensors array in accordance with the invention.

An example of a thermopile infrared sensors array will now be described for identifying the advantages of the invention using 0.5 um 2-polysilicon modified CMOS process. As for the sensors array, the suspending membrane area is 49×49 $\mu m^2$, the pixel area is 50×50 $\mu m^2$, the fill factor is 95%. The thermocouple materials are an N-type polysilicon with a resistance coefficient of 45 $\mu\Omega$-m and a thermoelectric power of 240 $\mu V/K$, and a P-type polysilicon with a resistance coefficient of 100 $\mu\Omega$-m and a thermoelectric power of 260 $\mu V/K$). The width of each of the polysilicon materials is 0.5 $\mu m$, the thickness thereof is 0.3 $\mu m$ (the thermal conductivity of the polysilicon is about 30 W/mK), and the number of thermocouples is N=2. At room temperature and in a vacuum condition (the pressure is less than $10^{-2}$ torr), assuming the optics F is unity and $\eta$ is 0.8 and $\Delta f$ is 1 Hz, then the theoretically ideal NETD value and responsivity Rv versus solid conductance Gs relation is illustrated in FIG. 10. Referring to FIG. 10, the horizontal axis represents the solid conductance, the left vertical axis represents the responsivity Rv, the right vertical axis represents NETD. From this figure, the optimal solid conductance under the above condition is about $5\times10^{-8}$ W/K, Rv is 18,000 V/W, and NETD is 0.00325° C.

When manufacturing the sensor in practice, the length of the thermocouple cantilever beam is set to 100 $\mu m$, the solid conductance is about $8\times10^{-8}$ W/K, and Rv is 10,000 V/W. The theoretically ideal NETD is 0.0035° C. This NETD value is far less than any ever reported results (including a bolometric and pyroelectric sensor).

Figure 11:
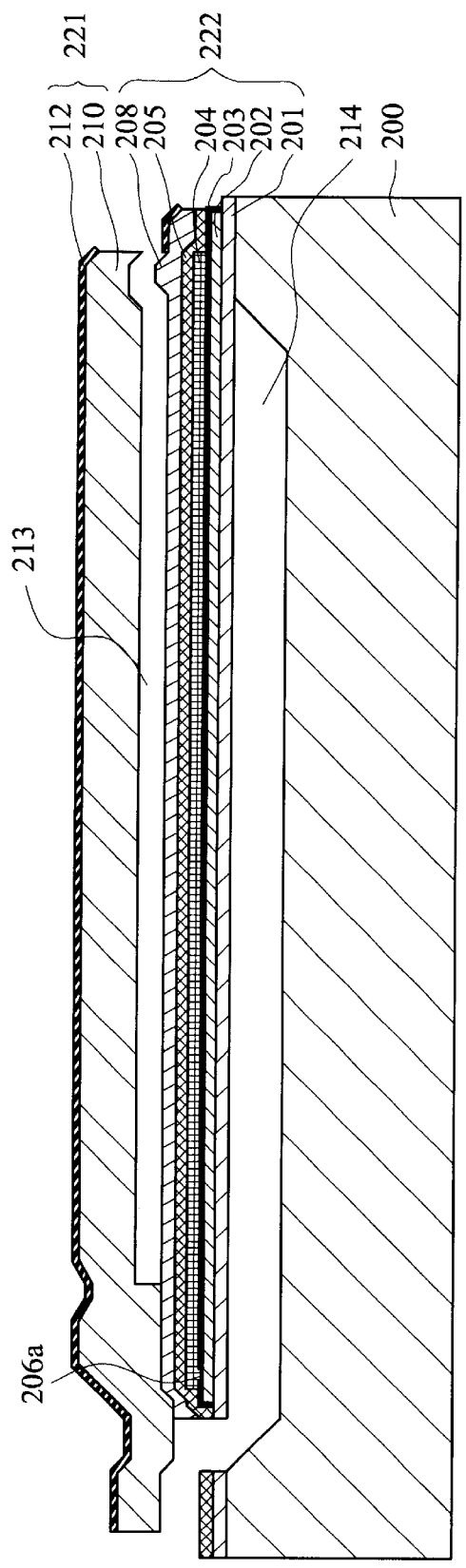
FIG. 11 is a cross-section view showing a thermopile infrared sensors array in accordance with another embodiment of the invention.

FIG. 11 is a cross-section view showing a thermopile infrared sensors array in accordance with another embodiment of the invention. Referring to FIG. 11, the thermocouple cantilever beam 222 is essentially constituted of an N-type or a P-type polysilicon conductor 202 and a metallic conductor 204. The polysilicon conductor 202 and the metallic conductor 204 are electrically connected to each other through a first wiring via hole 206a penetrating a second dielectric layer 203. Comparing FIG. 11 with FIG. 7, it is found that all the parts and arrangements except for the connection way of the two conductors of the thermocouple cantilever beam 222 are the same. As for the characteristics of the manufacturing processes, the first metal wiring layer 207 and the metallic conductor 204 can be formed of the same metallic material (e.g. aluminum).

While the invention has been described by way of example and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

For example, according to the spirit of the invention from Eq.(5), the inventor found that the total solid conductance of the thermopile can easily range from $1\times10^{-6}$ to $1\times10^{-8}$ (W/K), which can not be obtained in the conventional structure that has the order of magnitude of $10^{-5}$ (W/K) due to large number of thermocouples, to greatly improve the figure of merit of the sensor or sensors array.

What is claimed is:

1. A thermopile infrared sensor comprising:

a substrate;

at least one cantilever beam comprising at least one thermopile formed above said substrate, said cantilever beam having a first end and a second end away from said first end, said first end connecting with said substrate to form a cold junction, and a predetermined distance being formed between said second end and said substrate; and a suspending membrane formed above said at least one cantilever beam, said suspending membrane being supported by said second end of said cantilever beam to form a hot junction, and said at least one cantilever beam being substantially hidden underneath said suspending membrane.

2. The thermopile infrared sensor according to claim 1, wherein said at least one thermocouple of said cantilever beam is composed of an N-type and a P-type polysilicon conductor.

3. The thermopile infrared sensor according to claim 1, wherein said at least one thermocouple of said cantilever beam is composed of a polysilicon conductor and a metallic conductor.

4. The thermopile infrared sensor according to claim 1, wherein the total solid conductance of said at least one cantilever beam ranges from $1\times10^{-6}$ to $1\times10^{-8}$ (W/K).

5. A thermopile infrared sensors array including a plurality of thermopile sensors, each comprising:

a substrate;

at least one cantilever beam comprising at least one thermopile wherein said cantilever beam formed above said substrate, said cantilever beam having a first end and a second end away from said first end, said first end connecting with said substrate to form a cold junction, and a predetermined distance being formed between said second end and said substrate; and a suspending membrane formed above said at least one cantilever beam, said suspending membrane being supported by said second end of said cantilever beam to form a hot junction, and said at least one cantilever beam being substantially completely hidden underneath said suspending membrane.

6. The thermopile infrared sensors array according to claim 5, further comprising an integrated circuit formed in said substrate and electrically connected with said at least one cantilever beam to perform a predetermined processing to an output signal from said at least one cantilever beam.

7. The thermopile infrared sensors array according to claim 5, wherein said at least one thermocouple of said cantilever beam is composed of an N-type and a P-type polysilicon conductor.

8. The thermopile infrared sensors array according to claim 5, wherein said at least one thermocouple of said cantilever beam is composed of a polysilicon conductor and a metallic conductor.

9. The thermopile infrared sensor according to claim 5, wherein the total solid conductance of said at least one cantilever beam ranges from $1\times10^{-6}$ to $1\times10^{-8}$ (W/K).

10. A method for manufacturing a thermopile infrared sensor comprising the steps of:

forming at least one thermocouple and a first sacrificial layer on a substrate;

forming a second sacrificial layer on both of said thermocouple and said first sacrificial layer, and a via hole on said second sacrificial layer to expose a part of said at least one thermocouple;

forming a dielectric layer on both of said second sacrificial layer and said at least one thermocouple;

removing periphery portions of said dielectric layer to expose periphery portions of said second sacrificial layer;

etching said second sacrificial layer and the periphery portions of said first sacrificial layer to form undercuts under said dielectric layer;

forming a black absorber on said dielectric layer by way of self-deposition;

etching said second sacrificial layer and said first sacrificial layer through said undercuts to form a suspending membrane and expose a part of said substrate, wherein said suspending membrane is composed of said dielectric layer and said black absorber; and etching a predetermined portion of said substrate under said at least one thermocouple by way of anisotropic etching technology to form said at least one thermocouple in cantilever beam form.

11. The method according to claim 10, wherein each of said first and second sacrificial layer is selected from the group consisting of aluminum and its alloy.

12. The method according to claim 10, wherein the anisotropic etching technology is performed under a temperature between 80 and 100° C. by using an etchant having a low etching rate against the dielectric layer and is selected form the group consisting of hydrazine and TMAH, to remove a part of said substrate.

* * * * *